United States Patent
Kiehlbauch et al.

(10) Patent No.: US 8,500,913 B2
(45) Date of Patent: Aug. 6, 2013

(54) METHODS FOR TREATING SURFACES, AND METHODS FOR REMOVING ONE OR MORE MATERIALS FROM SURFACES

(75) Inventors: Mark Kiehlbauch, Boise, ID (US); Paul A. Morgan, Kuna, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 501 days.

(21) Appl. No.: 11/851,245

(22) Filed: Sep. 6, 2007

(65) Prior Publication Data
US 2009/0065026 A1   Mar. 12, 2009

(51) Int. Cl.
B08B 7/00   (2006.01)

(52) U.S. Cl.
USPC ............................................ 134/1.2; 438/906

(58) Field of Classification Search
None
See application file for complete search history.

(56) References Cited

U.S. PATENT DOCUMENTS

| | | | |
|---|---|---|---|
| 5,102,496 A * | 4/1992 | Savas | 216/69 |
| 5,796,111 A | 8/1998 | Mahoney | |
| 6,033,484 A | 3/2000 | Mahoney | |
| 6,313,042 B1 | 11/2001 | Cohen et al. | |
| 6,426,302 B2 | 7/2002 | Kitagawa | |
| 6,676,800 B1 | 1/2004 | Festa et al. | |
| 6,703,317 B1 | 3/2004 | Cheng et al. | |
| 2002/0142616 A1* | 10/2002 | Giewont et al. | 438/745 |
| 2004/0003828 A1 | 1/2004 | Jackson | |
| 2004/0045578 A1* | 3/2004 | Jackson | 134/1.2 |
| 2004/0137750 A1 | 7/2004 | Nemoto et al. | |
| 2004/0159638 A1* | 8/2004 | Demos et al. | 219/121.35 |
| 2004/0206452 A1* | 10/2004 | Okuda et al. | 156/345.11 |
| 2005/0003088 A1* | 1/2005 | Park et al. | 427/248.1 |
| 2005/0087136 A1* | 4/2005 | Moriya et al. | 118/719 |
| 2006/0118132 A1* | 6/2006 | Bergman et al. | 134/1 |
| 2006/0237667 A1 | 10/2006 | Ruzic et al. | |
| 2006/0254612 A1 | 11/2006 | Farrar | |
| 2006/0270242 A1 | 11/2006 | Verhaverbeke et al. | |

(Continued)

FOREIGN PATENT DOCUMENTS

KR   1995-0004971   5/1995
KR   2003-0002241   1/2003

(Continued)

OTHER PUBLICATIONS

Lee, J.M., et al. "Removal of small particles on silicon wafer by laser-induced airborne plasma shock waves" Journal of Applied Physics, vol. 89, No. 11, Jun. 1, 2001, pp. 6496-6500.

(Continued)

*Primary Examiner* — Nicole Blan
(74) *Attorney, Agent, or Firm* — Wells St. John P.S.

(57) ABSTRACT

Some embodiments include utilization of both plasma and aerosol to treat substrate surfaces. The plasma and aerosol may be utilized simultaneously, or sequentially. In some embodiments, the plasma forms a plasma sheath over the substrate surfaces, with the plasma sheath having an electric field gradient therein. The aerosol comprises liquid particles charged to a polarity, and such polarity is transferred to contaminants on the substrate surfaces through interaction with the aerosol. The polarity may be used to assist in dislodging the contaminants from the substrate surfaces. The electric field of the plasma sheath may then sweep the contaminants away from the substrate surfaces. In some embodiments, multiple different aerosols are formed to remove multiple different types of materials from substrate surfaces. Some embodiments include apparatuses configured for treating substrate surfaces with both plasma and aerosol.

8 Claims, 7 Drawing Sheets

U.S. PATENT DOCUMENTS

| | | |
|---|---|---|
| 2006/0278254 A1 | 12/2006 | Jackson |
| 2007/0084485 A1 | 4/2007 | Freer et al. |
| 2007/0087949 A1* | 4/2007 | Wu et al. .................... 510/175 |
| 2007/0093071 A1 | 4/2007 | Verhaverbeke et al. |
| 2007/0117397 A1 | 5/2007 | Fu et al. |
| 2007/0125400 A1 | 6/2007 | Matsui |
| 2007/0151583 A1 | 7/2007 | Freer et al. |
| 2007/0163621 A1 | 7/2007 | Ishizaka et al. |
| 2007/0169794 A1 | 7/2007 | Han et al. |
| 2007/0202254 A1* | 8/2007 | Ganguli et al. ............. 427/252 |

FOREIGN PATENT DOCUMENTS

| | | |
|---|---|---|
| KR | 2003-0058304 | 7/2003 |
| TW | 575921 | 2/2004 |
| TW | 248112 B | 1/2006 |

OTHER PUBLICATIONS

Moslehi, Mehrdad M., et al. "Single-Wafer Integrated Semiconductor Device Processing" IEEE Transactions on Electron Devices. vol. 39, No. 1, Jan. 1992, pp. 4-32.

Soh, Hyun, et al. "Remote R.F. Plasma Cleaning for the Removal on Organic Impurity" Dept. of Chemical Engineering, Hanyang University, Seoul, Korea 6PA15, p. 104.

* cited by examiner

METHODS FOR TREATING SURFACES, AND METHODS FOR REMOVING ONE OR MORE MATERIALS FROM SURFACES

TECHNICAL FIELD

Methods for treating surfaces, methods for removing one or more materials from surfaces, and apparatuses for treating surfaces.

BACKGROUND

It is frequently desired to remove materials from over substrate surfaces. For instance, semiconductor fabrication may involve removal of contaminant particulates from over a semiconductor substrate surface, and/or stripping of sacrificial materials from over a semiconductor substrate surface. The terms "semiconductive substrate," "semiconductor construction" and "semiconductor substrate" mean any construction comprising semiconductive material (for instance, silicon and/or germanium), including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Numerous cleaning solutions and chemistries have been developed for removing materials from over semiconductor substrate surfaces. The cleaning solutions may, for example, comprise deionized water. The water may be utilized alone, or in combination with one or more of sulfuric acid, hydrochloric acid, hydrofluoric acid, ammonium hydroxide, hydrogen peroxide, etc. Accordingly, cleaning solutions may be acidic, basic, or of neutral pH, depending on the application.

Some materials are fairly easy to clean from over semiconductor substrates, in that the materials are chemically much different than the underlying surface of the semiconductor substrate. However, other materials can be difficult to remove selectively relative to an underlying surface of a semiconductor substrate in that the materials may be of the same composition, or of a similar composition, as one or more regions of the surface of the semiconductor substrate. Materials that can be particularly difficult to remove in some applications are silicon, silicon dioxide, silicon nitride, and polymeric organic materials.

A method being developed for removal of materials is to utilize liquid aerosol particles (which may also be referred to as clusters) to impact a surface of a semiconductor substrate and dislodge undesired materials from such surface. The liquid aerosol particles may dislodge the materials by physical interaction (analogous to bead-blasting), chemical interaction (in other words, reaction with the materials to convert them to a form more readily dislodged than an initial form), or a combination of physical interactions and chemical interactions. In some applications, the liquid aerosol particles may be charged so they have a polarity (either positive or negative), and the liquid aerosol particles may impart such polarity to the undesired materials on the substrate surface. The substrate may be charged to the same polarity as that imparted to the undesired materials so that electrostatic repulsion occurs between the substrate surface and the undesired materials to assist in dislodging such materials from the surface.

The liquid aerosol particles may be formed by passing liquid to an aerosol generator. The aerosol generator may be an aerosolizing (or atomizing) nozzle or spray head, such as, for example, an electrostatic nozzle, a piezoelectric nozzle, an ultrasonic or megasonic nozzle, or an electrohydrodynamic atomization nozzle. The term "aerosol" means a suspension or dispersion of fine particles (which may be referred to as clusters or droplets in some embodiments). The term "liquid aerosol particle" means aerosol particles that are primarily of a liquid phase, and is synonymous with the term "aerosol droplet". The liquid aerosol particles may have a volume of less than three picoliters; may have a mean size distribution of less than 10 microns, and in some applications may have a mean size distribution of less than 100 nanometers.

The liquid aerosol particles may be directed toward a substrate surface via any suitable method, including, for example, spraying (fluid force propulsion), gas jet, electrostatic forces, etc.

Although aerosols have potential for utilization in cleaning various substrates, such as semiconductor substrates, they currently have limited application. It is desired to develop improved methods for cleaning substrates, such as semiconductor substrates, which improve applicability for utilization of aerosols in diverse applications.

DETAILED DESCRIPTION OF THE ILLUSTRATED EMBODIMENTS

In some embodiments, plasma is utilized in conjunction with aerosol for treating substrate surfaces. The plasma and aerosol may be utilized simultaneously, or sequentially. The substrate may be anything which is desired to be treated, and in some embodiments may be a semiconductor substrate, such as, for example, a monocrystalline silicon wafer at a processing stage before, during or after integrated circuit fabrication. The treatment may include cleaning of undesired particulates from substrate surfaces and/or stripping of materials from the substrate surfaces.

Example embodiments are described with reference to FIGS. 1-14.

Figure 1:
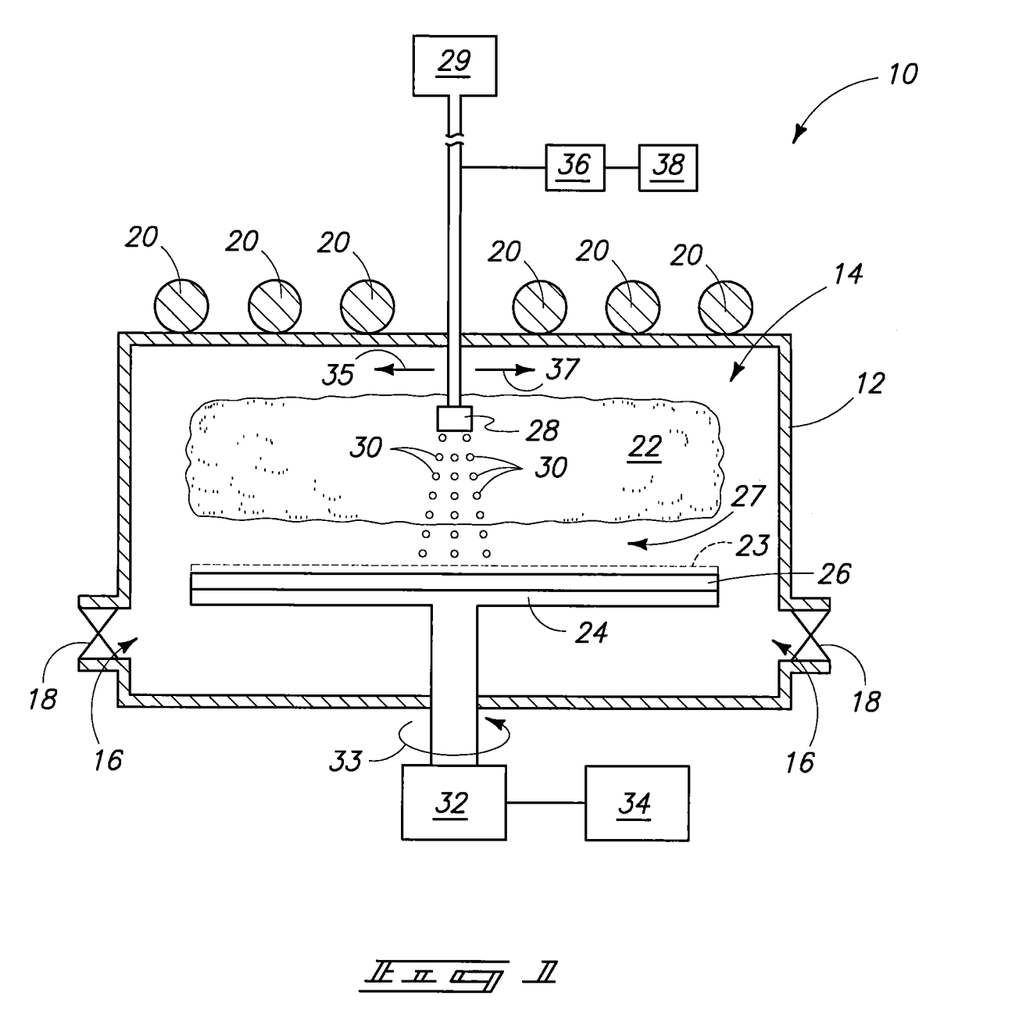
FIG. 1 is a diagrammatic view of an apparatus utilized for treating a substrate surface in accordance with an embodiment.

Referring to FIG. 1, an example apparatus 10 is illustrated being utilized in a process for simultaneous treatment of a substrate surface with plasma and aerosol. The apparatus includes a sidewall 12 that extends around a reaction chamber 14.

Ports 16 extend through the sidewall to the chamber, and valves 18 regulate flow of materials through the ports. The ports are utilized for inlets and outlets to the chamber. In operation, reactant materials and/or purge gases may be flowed into the chamber through one or more of the ports; and reaction byproducts and/or unreacted reactants may be exhausted from the chamber through one or more of the ports. The valves may be utilized to control flow into and out of the chamber so that desired pressures of materials may be provided within the chamber. One or more of the ports may be in fluid communication with a pump (not shown), which may assist in regulating flow of materials into and out of the chamber.

Coils 20 extend around sidewall 12. The coils may be utilized for inducing plasma within the chamber 14, such as the shown plasma 22. Numerous methods are known which may be used for inducing and maintaining plasma within the chamber, including, for example, capacitive coupling and radiofrequency (RF) coupling. Any suitable method may be used for inducing and maintaining a plasma within the chamber. The coils may be considered to be comprised by plasma generation circuitry that is proximate the chamber and utilized for forming and maintaining a plasma within the chamber.

A substrate holder 24 is within the chamber, and such retains a substrate 26. The substrate holder may be configured to retain specific types of substrates. In some embodiments, the substrate 26 may correspond to a semiconductor substrate, and the substrate holder may be configured to retain the semiconductor substrate (for instance, the substrate holder may have a recess with a size and shape complementary to the semiconductor substrate).

The formation of plasma 22 within the chamber 14 generates plasma sheathes along exposed surfaces within the chamber. The plasma sheath over an upper surface of substrate 26 is diagrammatically illustrated by a dashed line 23. Such plasma sheath will typically be very thin, and may, for example, have a thickness of less than or equal to a few Debye lengths (for instance, a thickness of less than 10 millimeters, or even less than one millimeter). The thickness of the plasma sheath may depend on a pressure within the chamber and the electron density within the chamber; with high-pressure/high electron-density conditions frequently forming thinner plasma sheaths than low-pressure/low electron-density conditions.

An aerosol-forming nozzle 28 is within the chamber, and in fluid connection with a reservoir 29. In operation, liquid is passed from reservoir 29 and through nozzle 28, whereupon it is atomized. The atomized liquid is then dispersed into the chamber as liquid aerosol particles (diagrammatically illustrated as aerosol particles 30, only some of which are labeled). The aerosol-forming nozzle may be comprised by any suitable aerosol generator, and may, for example, correspond to an electrostatic nozzle, a piezoelectric nozzle, an ultrasonic or megasonic nozzle, or an electrohydrodynamic atomization nozzle.

In the shown embodiment, the nozzle 28 generates aerosol within plasma 22. In other embodiments, the nozzle 28 may generate aerosol above plasma 22, or below the bulk of plasma 22 (for instance, in a region 27 between the bulk of plasma 22 and the plasma sheath 23).

Although nozzle 28 is shown within chamber 14, in other embodiments the nozzle may be external of the chamber so that aerosol is formed outside of the chamber, and then passed through an opening in the chamber sidewall to enter the chamber. In any event, nozzle 28 will be proximate the chamber so that aerosol formed by the nozzle may be directed toward the upper surface of the substrate 26 retained within the chamber.

The aerosol particles 30 are directed toward an upper surface of substrate 26. Such may be accomplished by fluid-force propulsion through nozzle 28. The propulsion of the aerosol particles toward the substrate surface may alternatively, or additionally, include blending a gas jet with the fluid stream entering nozzle 28, and utilizing the gas stream to push the aerosol toward the substrate. In some embodiments, the propulsion of the aerosol particles toward the substrate surface may alternatively, or additionally, include providing electrical charge to the aerosol particles and to one or more components within the chamber so that the aerosol particles may be electrostatically attracted and/or repelled from various components to direct the aerosol particles toward the substrate. For instance, focusing rings and/or electrodes of the types described in U.S. patent publication number 2006/0118132 may be utilized to direct the aerosol particles.

The aerosol particles 30 are shown impacting a small region of the upper surface of substrate 26. In some embodiments, it may be desired to treat only specific small regions of the upper surface of the substrate. In other embodiments, it may be desired to uniformly treat an entirety of the upper surface of the substrate. If it is desired to treat the entirety of the upper surface of the substrate, multiple nozzles may be used to create aerosol coverage across the entire surface. Alternatively, or additionally, one or both of the substrate and the aerosol-generating nozzle may be moved during treatment of the substrate. For instance, substrate holder 24 is shown connected to a motor 32 which in turn is connected with a power source 34. The motor may be configured to rotate the substrate holder (as illustrated by arrow 33) when powered by the source 34. The rotation of the substrate holder rotates substrate 26. Rotation of substrate 26 may enable more uniform treatment of an upper source of the substrate than would be achieved without rotation. Also, nozzle 28 is shown coupled to a motor 36, which in turn is coupled to a power source/control unit 38. The motor 36 may be utilized for moving the nozzle 28 laterally within the chamber (as illustrated by arrows 35 and 37) which, in combination with rotation of substrate 26, may enable the nozzle to be utilized for treatment of the entire surface of substrate 26. Also, the angular tilt of the nozzles relative to the substrate may be adjusted to enhance particle movement and/or sweeping.

Although all of the aerosol is shown directed toward the substrate, in practice the aerosol may disperse within the chamber so that some of the aerosol particles do not reach the substrate surface.

Any suitable conditions may be utilized during the utilization of the plasma and aerosol. For instance, the pressure may be from sub-millitorr to atmospheric, and in some embodiments may exceed atmospheric pressure.

The substrate surface is exposed to both plasma and aerosol in the embodiment of FIG. 1. An advantage of utilizing plasma in combination with aerosol during removal of materials from over a substrate is that the plasma may enhance removal relative to that which would occur utilizing the aerosol alone, and the aerosol may enhance removal relative to that which would occur utilizing the plasma alone. The aerosol particles and plasma may each be referred to as "assisting" with ejection of particulates from over a substrate surface in that the ejection may comprise multiple procedures utilized in concert, rather than the single procedure of either aerosol or plasma utilized alone.

In some embodiments, the aerosol particles 30 may have a charge polarity (either positive or negative) imparted by the nozzle 28, and such polarity may be transferred to particulates associated with the substrate 26 upon interaction of the aerosol particles with the particulates on the substrate. The substrate may be provided with a polarity identical to that of the aerosol particles so that repulsive forces help to dislodge the particulates from the substrate. The plasma sheath 23 will comprise an electric field, and such electric field may be configured to interact with the polarity induced in the particulates on the substrate to assist in sweeping the particulates from the substrate surface and into the reaction chamber.

In some embodiments, the plasma may comprise constituents that are reactive relative to materials that are to be removed from a substrate surface so that the plasma chemically assists with the removal of the materials from the substrate surface.

The treatment of the substrate surface with the plasma and aerosol may be utilized for removal of contaminating particulate from the substrate surface, and/or for stripping sacrificial materials from the substrate surface. If the plasma and aerosol are utilized for stripping sacrificial materials, the bulk of the stripping may be conducted with the plasma. The aerosol may then be utilized for removal of particulates formed during the bulk of the stripping.

The aerosol and plasma may be utilized simultaneously with one another (as shown in FIG. 1), and/or may be utilized sequentially so that either plasma is present in the chamber without aerosol, aerosol is present in the chamber without plasma, or both aerosol and plasma are present within the chamber at non-overlapping times relative to one another. For instance, plasma may be provided within the chamber for a longer duration than aerosol so that there is a time when plasma is within the chamber without aerosol, and another time when both plasma and aerosol are present within the chamber. Alternatively, aerosol may be provided for a longer duration than plasma so there is a time when aerosol is present without plasma, and another time when both plasma and aerosol are present within the chamber. In yet other alternative embodiments, aerosol may be provided within the chamber without plasma, and plasma provided in the chamber without aerosol, regardless of the duration for which the aerosol and plasma are provided.

Once the plasma is generated, it may be moved (swept over the surface) to physically move the trapped particulates from one region to another. Other means, such as, for example, changing the electric field and/or chamber pressure, may also be used to move trapped particulates from one region to another.

The aerosol may comprise any droplets suitable for the intended removal of particular materials from over the surface of substrate 26. For instance, if the substrate corresponds to a semiconductor substrate, the aerosol droplets may comprise traditional cleaning liquids utilized for cleaning a semiconductor substrate surface; and may, for example, comprise, consist essentially of, or consist of deionized water, either alone, or in combination with one or more of sulfuric acid, hydrochloric acid, hydrofluoric acid, ammonium hydroxide, hydrogen peroxide, etc. Accordingly, the aerosol droplets may be of basic pH, neutral pH, or acidic pH in various embodiments.

The plasma may be inert relative to reaction with materials over the surface of substrate 26, and may, for example, consist of noble elements, such as one or more of Ar, Xe, Ne and Kr, and may be utilized at low bias (for instance, less than about 10 volts, and in some embodiments less than about 5 volts) to avoid chemical reaction of plasma with materials associated with the substrate surface. Alternatively, the plasma may comprise materials which impart chemistry to materials associated with the substrate surface. For instance, if the substrate comprises a semiconductor substrate, the plasma may comprise materials which impart oxidizing chemistry, reducing chemistry, or other chemistries. For example, the plasma may comprise one or more components selected from the group consisting of hydrogen-containing components, halogen-containing components, oxygen-containing components and nitrogen-containing components. Specific materials that may be included in the plasma are $NF_3$, $SF_6$, $CF_4$, $C_xH_yF_z$ (where "x", "y" and "z" are greater than zero), $O_2$, $O_3$, $CO_q$ (where "q" is greater than zero), $NO_p$ (where "p" is greater than zero), $H_2$, $NH_3$, $N_2$, $Cl_2$, HCl, HBr, $CCl_4$, HF and $H_2O$.

In some embodiments, the plasma and aerosol may work synergistically to remove a particulate material. For instance, the aerosol may comprise BF to chemically interact with silicon dioxide, and the plasma may comprise $O_3$ to chemically interact with silicon and convert the silicon to silicon dioxide. Thus, the plasma may convert silicon to silicon dioxide, which is then removed with the aerosol.

Figure 2:
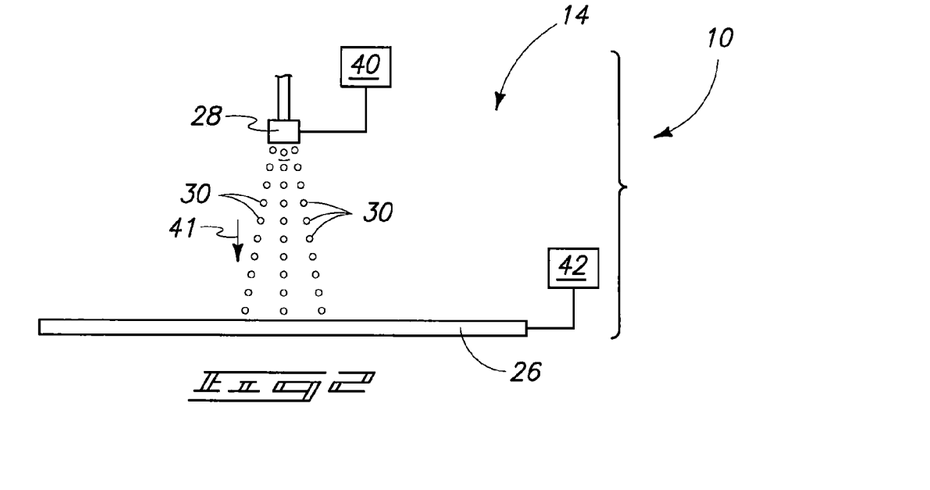
FIGS. 2-4 show diagrammatic views of an apparatus at three processing stages for treating a substrate surface in accordance with an embodiment.
Figure 3:
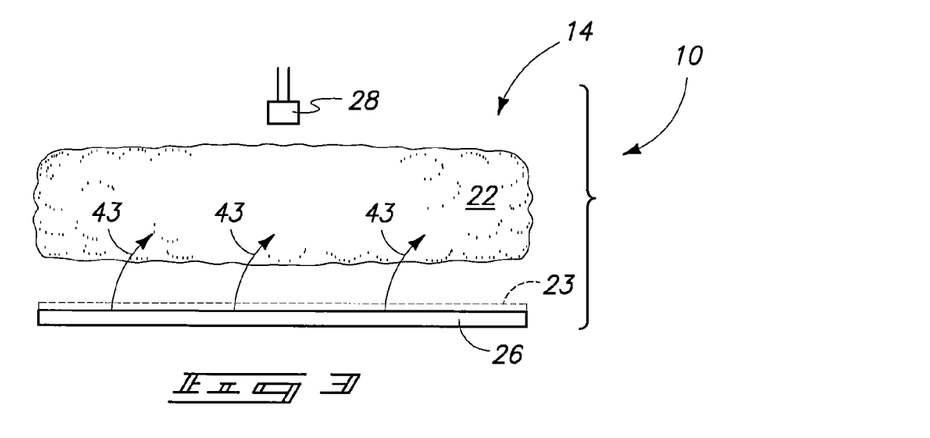
Figure 4:
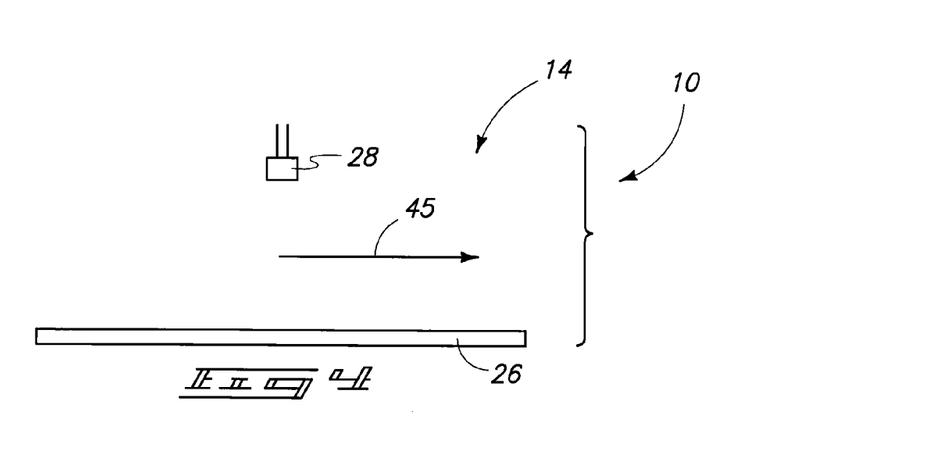

FIGS. 2-4 illustrate an embodiment in which aerosol and plasma are provided within a reaction chamber at non-overlapping times relative to one another. In referring to FIGS. 2-4, similar numbering will be used as is utilized above in describing FIG. 1, where appropriate.

Referring to FIG. 2, a portion of apparatus 10 is illustrated. The portion is a region within chamber 14. The sidewall 12 (FIG. 1), coils 20 (FIG. 1) and numerous other components of the apparatus of FIG. 1 are not illustrated in FIG. 2 in order to simplify the drawing.

FIG. 2 shows a nozzle 28 forming liquid aerosol particles 30. The aerosol particles are directed toward an upper surface of substrate 26 along a direction indicated by arrow 41. Nozzle 28 is shown coupled with a power source 40, and substrate 26 is shown coupled with a power source 42. The nozzle 28 may be an electrohydrodynamic nozzle powered by source 40. Further, the power source 40 may be utilized to induce a polarity to the aerosol particles 30.

Power source 42 may induce a polarity onto substrate 26. In some embodiments the polarity induced on substrate 26 may be opposite to that induced on aerosol particles 30 (for instance, the polarity on the aerosol particles may be negative and that induced on the upper surface of substrate may be positive). The opposite polarities cause the aerosol particles 30 to be electrostatically attracted to the upper surface of the substrate. In other embodiments, the polarity induced on substrate 26 may be the same as that induced on the aerosol particles so that repulsive electrostatic forces between the particles and the substrate help to remove contaminants from the substrate upon interaction of the contaminants with the aerosol particles.

The aerosol is within the chamber in the absence of plasma.

Referring to FIG. 3, aerosol generation is ceased within the chamber, and then plasma 22 is formed within chamber. The plasma formation includes formation of the plasma sheath 23 over an upper surface of substrate 26. An electric field gradient within the plasma sheath sweeps contaminants away from the upper surface of substrate 26 and into the bulk plasma 22 (as illustrated by arrows 43). The contaminants may be negatively charged, and the electric field gradient within the plasma sheath may thus be a gradient which progresses from negative to positive as it ascends above a surface of substrate 26. Alternatively, the contaminants may be positively charged, and the electric field gradient within the plasma sheath may thus be a gradient which progresses from positive to negative as it ascends above a surface of substrate 26. It may be more difficult to form a gradient suitable for sweeping positively-charged particles than for sweeping negatively-charged particles. However, a suitable gradient may be transiently generated as a plasma is switched on and off within a chamber.

The plasma may comprise chemistry which interacts with materials along the upper surface of substrate 26, or may be chemically neutral (i.e., inert) relative to the materials exposed along the upper surface of substrate 26.

Referring to FIG. 4, plasma generation is ceased, and the plasma components (i.e., the gasses and materials that had been within the plasma) are then exhausted from within the chamber as indicated by arrow 45. The contaminants will be exhausted from within the chamber with the plasma components.

Figure 5:
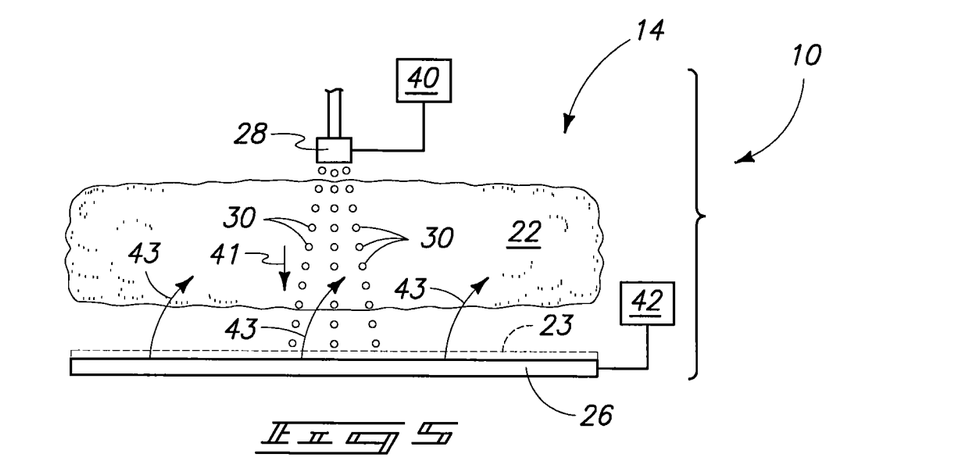
FIGS. 5 and 6 show diagrammatic views of an apparatus at two processing stages for treating a substrate surface in accordance with an embodiment.
Figure 6:
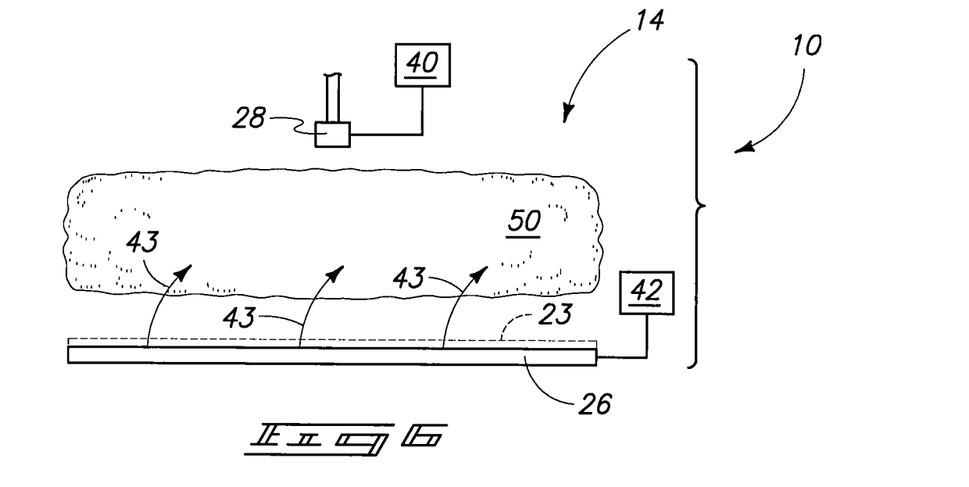

FIGS. 5 and 6 illustrate an embodiment in which plasma is provided within a reaction chamber with aerosol, and then without aerosol. The embodiment of FIGS. 5 and 6 may be a process in which a plasma is maintained for a longer duration than aerosol formation is conducted. Alternatively, the embodiment of FIGS. 5 and 6 may be a process in which first plasma chemistry is utilized with aerosol, and then second plasma chemistry is utilized after ceasing formation of aerosol. In referring to FIGS. 5 and 6, similar numbering will be used as is utilized above in describing FIG. 1, where appropriate.

FIG. 5 shows the portion of the apparatus 10 utilized above in describing the embodiment of FIGS. 2-4, and shows such portion at a process stage similar to that discussed above with reference to FIG. 1. Specifically, the apparatus has the nozzle 28 forming the liquid aerosol particles 30, and has the plasma 22 within the chamber 14. The aerosol is directed through a space in the chamber toward an upper surface of substrate 26; and specifically is directed along the direction 41 through the plasma 22 and plasma sheath 23. Nozzle 28 is shown coupled with the power source 40, and substrate 26 is shown coupled with the power source 42. The power sources 40 and 42 may induce polarities onto aerosol particles 30 and substrate 26, respectively, as discussed above with reference to FIG. 2.

The plasma may comprise chemistry which interacts with materials along the upper surface of substrate 26, or may be chemically neutral relative to the materials exposed along the upper surface of substrate 26. In some embodiments, the plasma and aerosol chemically interact with the same species exposed on the substrate (for instance, the plasma and aerosol may both chemically interact with silicon dioxide). In other embodiments, the plasma and aerosol may chemically interact with different species exposed on the substrate (for instance, the aerosol may comprise HF to chemically interact with silicon dioxide, and the plasma may comprise $O_3$ to chemically interact with organic material and/or silicon). In yet other embodiments, the aerosol may chemically interact with species exposed on the substrate, and the plasma may consist of components that are inert relative to chemical reaction with species exposed on the substrate. In yet other embodiments, the aerosol and plasma may both consist of components that are inert relative to chemical reaction with species exposed on the substrate. The components inert relative to chemical reaction with species exposed on a substrate may still dislodge such species through physical interactions (analogous to blasting with microscopic beads); and/or by loose physical attraction of charged components to the species to form a charged cluster comprising the species, coupled with electrostatic repulsion of the charged cluster from the substrate.

Referring to FIG. 6, aerosol generation is ceased within the chamber, and a plasma 50 is utilized in the absence of the aerosol. The plasma 50 may be the same as the plasma 22, and accordingly may be a continuation of the duration of plasma 22. Such continuation of plasma chemistry in the absence of the aerosol may be beneficial in removing some materials, such as, for example, materials that chemically react with components of the plasma to form volatile products. In other embodiments, the plasma chemistry may be switched after the ceasing of the aerosol so that plasma 50 has a different composition than plasma 22. The ceasing of the aerosol prior to the switching of plasma chemistry may enable plasma chemistries to be utilized that would be incompatible with the aerosols.

The electric field gradient 23 within the plasma sheath is shown sweeping contaminants away from an upper surface of substrate 26 and into the bulk plasma 50 (as illustrated by arrows 43). In other embodiments, the plasma chemistry may comprise components reactive with materials on the surface of substrate 26, and such reaction may form products that leave the surface of the substrate regardless of the electric field of the plasma sheath.

Figure 7:
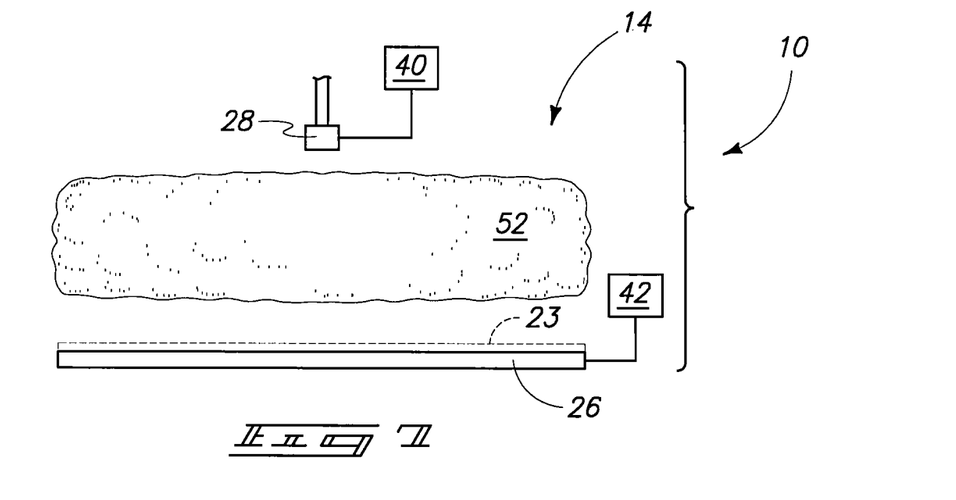
FIGS. 7 and 8 show diagrammatic views of an apparatus at two processing stages for treating a substrate surface in accordance with an embodiment.
Figure 8:
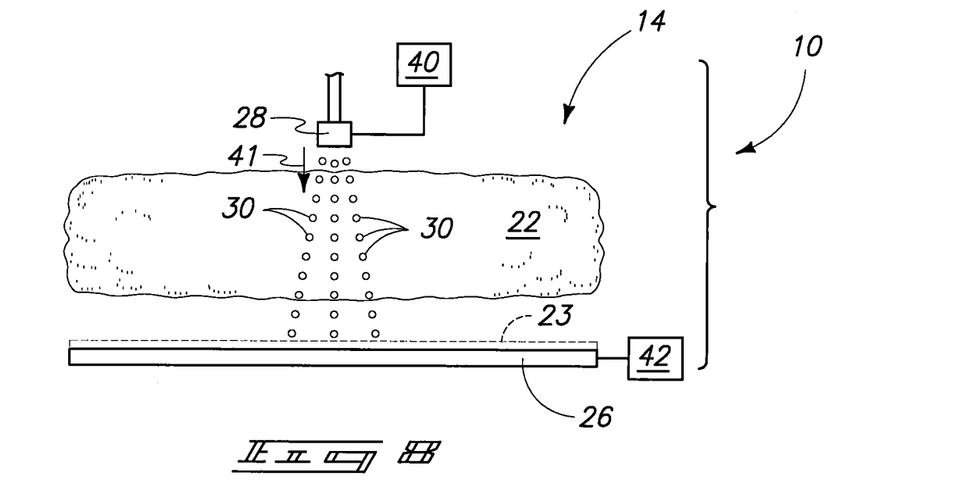

FIGS. 7 and 8 illustrate an embodiment like that of FIGS. 5 and 6, but in which plasma is initially within a reaction chamber without aerosol, and then the aerosol is subsequently introduced into the chamber. In referring to FIGS. 7 and 8, similar numbering will be used as is utilized above in describing FIGS. 5 and 6.

FIG. 7 shows the portion of the apparatus 10 utilized above in describing the embodiment of FIGS. 2-4, and shows such portion at a process stage where plasma 52 is within the chamber, but aerosol is not formed within the chamber.

FIG. 8 shows a plasma 52 within the chamber 14, shows aerosol formation occurring within the chamber, and shows the liquid aerosol particles 30 directed toward an upper surface of substrate 26.

The utilization of plasma prior to utilization of the aerosol may enable plasma chemistry to be utilized to form materials that are subsequently removed with the aerosol. The plasma 52 may be the same in composition as plasma 22 so that FIG. 8 is a continued duration of the same plasma as FIG. 7. In other embodiments, the plasma chemistry may be switched so that a different plasma chemistry is utilized with the aerosol than is utilized in the absence of the aerosol. For instance, the plasma chemistry may be switched if the first plasma chemistry is incompatible with the aerosol. Other example embodiments in which the plasma chemistry is switched comprise utilization of the first plasma chemistry of FIG. 7 to remove materials that expose underlying materials suitable for removal with the aerosol and second plasma chemistry of FIG. 8, and/or to generate materials suitable for subsequent removal with the aerosol and second plasma chemistry of FIG. 8.

Figure 9:
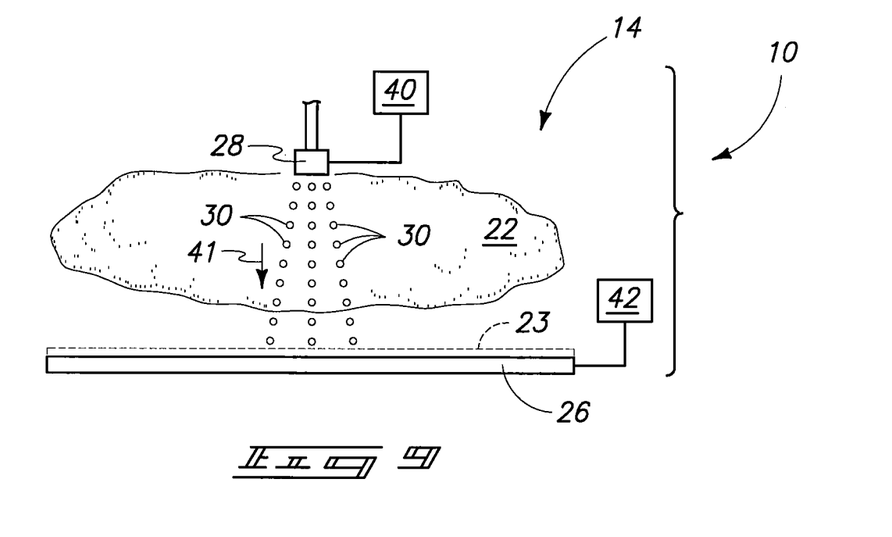
FIGS. 9 and 10 show diagrammatic views of an apparatus at two processing stages for treating a substrate surface in accordance with an embodiment.
Figure 10:
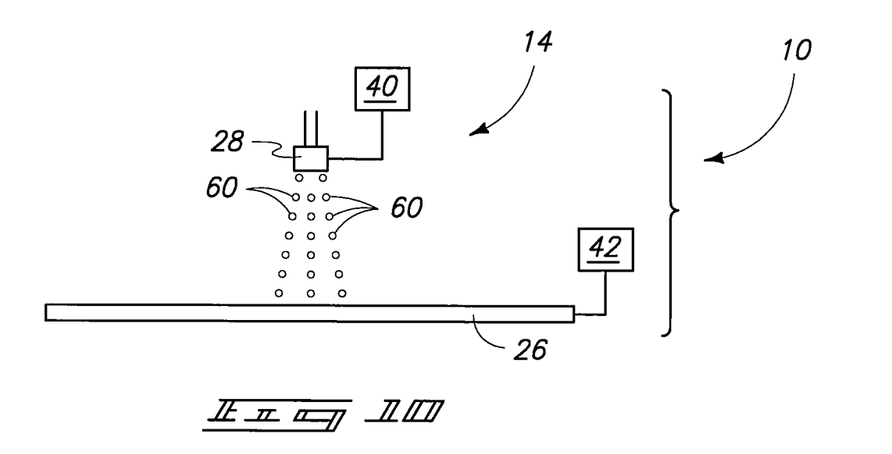

The embodiments of FIGS. 5-8 illustrate processes in which plasma is provided in a reaction chamber in the absence of aerosol. In alternative embodiments, aerosol may be provided without plasma. For instance, FIGS. 9 and 10 illustrate an embodiment in which aerosol is provided within a reaction chamber with plasma, and then without plasma. The embodiment of FIGS. 9 and 10 may be a process in which an aerosol is formed for a longer duration than plasma is maintained. Alternatively, the embodiment of FIGS. 9 and 10 may be a process in which first aerosol chemistry is utilized with plasma, and then second aerosol chemistry is utilized after ceasing maintenance of plasma. In referring to FIGS. 9 and 10, similar numbering will be used as is utilized above in describing FIG. 1, where appropriate.

FIG. 9 shows the portion of the apparatus 10 utilized above in describing the embodiment of FIGS. 2-4, and shows such portion at a process stage similar to that discussed above with reference to FIG. 1. Specifically, the apparatus has the nozzle 28 forming the liquid aerosol particles 30, and has the plasma 22 within the chamber 14. The aerosol is directed through a space in the chamber toward an upper surface of substrate 26;

and specifically is directed along the direction 41 through the plasma 22 and plasma sheath 23. Nozzle 28 is shown coupled with the power source 40, and substrate 26 is shown coupled with the power source 42. The power sources 40 and 42 may induce polarities onto aerosol particles 30 and substrate 26, respectively, as discussed above with reference to FIG. 2.

The plasma may comprise chemistry which interacts with materials along the upper surface of substrate 26, or may be chemically neutral relative to the materials exposed along the upper surface of substrate 26, as discussed above with reference to FIG. 5.

Referring to FIG. 10, plasma maintenance is ceased within the chamber, and an aerosol comprising aerosol particles 60 is utilized in the absence of the plasma. The aerosol particles 60 may be the same as the aerosol particles 30, and accordingly the aerosol of FIG. 10 may be a continuation of that of FIG. 9. Such continuation of an aerosol in the absence of the plasma may be beneficial in removing some materials. In other embodiments, the aerosol chemistry may be switched after the ceasing of the plasma so that aerosol particles 60 have a different composition than aerosol particles 30. The ceasing of the plasma prior to the switching of aerosol chemistry may enable aerosol chemistries to be utilized that would be incompatible with the plasma.

Figure 11:
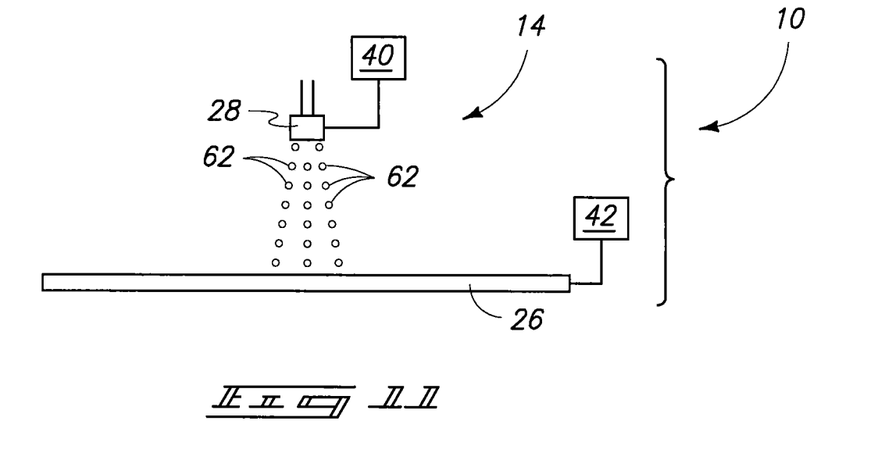
FIGS. 11 and 12 show diagrammatic views of an apparatus at two processing stages for treating a substrate surface in accordance with an embodiment.
Figure 12:
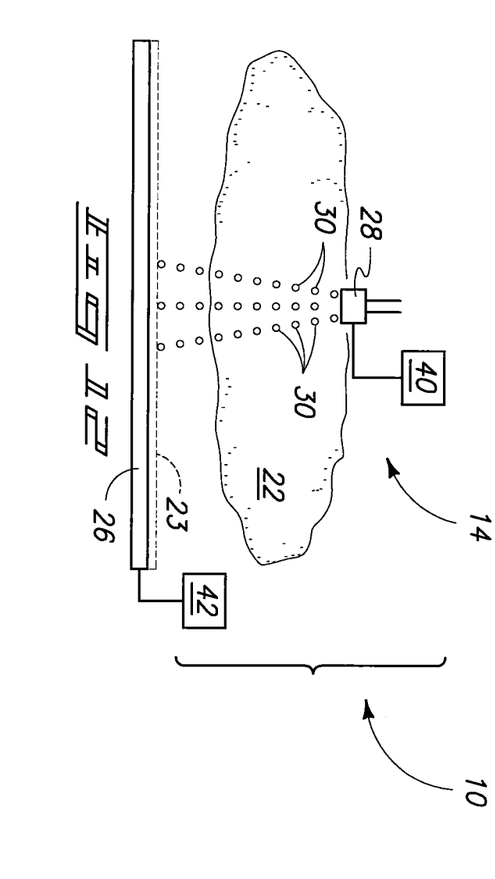

FIGS. 11 and 12 illustrate an embodiment like that of FIGS. 9 and 10, but in which aerosol is initially within a reaction chamber without plasma, and then the plasma is subsequently provided in the chamber. In referring to FIGS. 11 and 12, similar numbering will be used as is utilized above in describing FIGS. 9 and 10.

FIG. 11 shows the portion of the apparatus 10 utilized above in describing the embodiment of FIGS. 2-4, and shows such portion at a process stage where aerosol particles 62 are within the chamber 14, but plasma is not formed within the chamber.

FIG. 12 shows the plasma 22 within the chamber 14, shows aerosol formation occurring within the chamber, and shows the liquid aerosol particles 30 directed toward an upper surface of substrate 26.

The utilization of aerosol prior to utilization of the plasma may enable aerosol chemistry to be utilized to form materials that are subsequently removed with the plasma. The aerosol particles 62 may be the same in composition as the aerosol particles 30 so that FIG. 12 is a continued duration of the same aerosol as FIG. 11. In other embodiments, the aerosol chemistry may be switched so that a different aerosol chemistry is utilized with the plasma than is utilized in the absence of the plasma. The first aerosol chemistry may be incompatible with the plasma.

Figure 13:
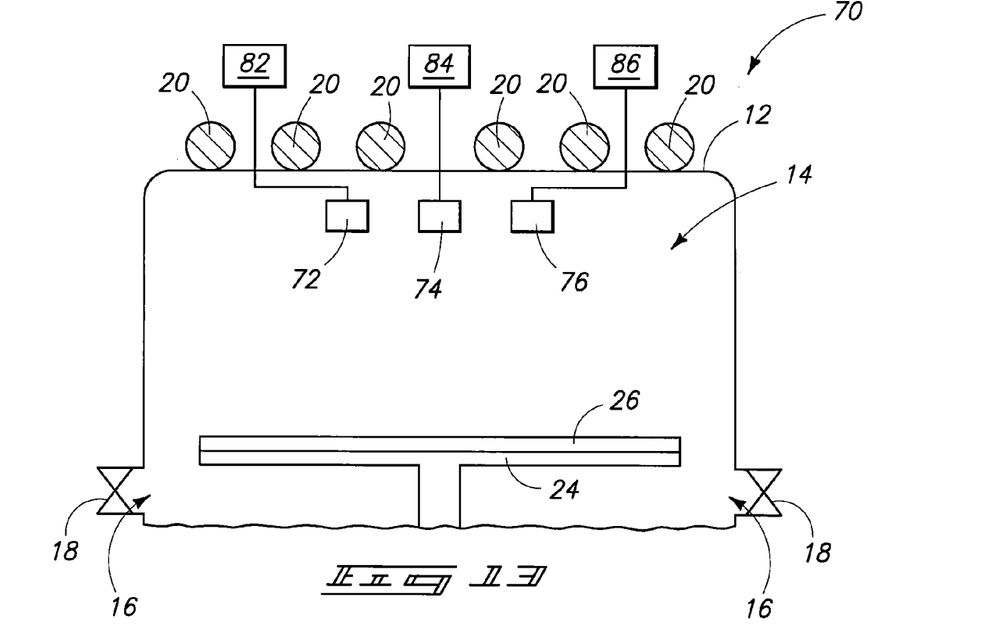
FIGS. 13 and 14 show diagrammatic views of an apparatus at two processing stages of an embodiment.

The embodiments discussed above with reference to FIGS. 1-12 show a single atomization nozzle providing aerosol particles into a reaction chamber. In other embodiments, multiple nozzles may be utilized. Additionally, multiple fluid reservoirs may be utilized so that one or more of the nozzles provides aerosol of different composition than others of the nozzles. FIG. 13 illustrates an example apparatus 70 comprising multiple atomization nozzles. In referring to FIG. 13, similar numbering will be used as is used above in describing FIG. 1, where appropriate.

The apparatus 70 comprises the sidewall 12 and the reaction chamber 14 discussed above with reference to FIG. 1. Apparatus 70 is shown more diagrammatically than the apparatus 10 of FIG. 1. For instance, the sidewall 14 of apparatus 70 is represented by a single line, and conduits extending through the sidewall are represented by lines passing over the single line of the sidewall. The apparatus 70 comprises the ports 16, valves 18, substrate holder 24, and coils 20 that were discussed above with reference to FIG. 1. Additionally, a substrate 26 of the type discussed above with reference to FIG. 1 is shown retained on substrate holder 24.

Apparatus 70 comprises a plurality of atomizing nozzles 72, 74 and 76. Such nozzles may comprise any of the nozzle configurations discussed above relative to the atomizing nozzle 28 of FIG. 1. Accordingly, nozzles 72, 74 and 76 may, for example, correspond to electrohydrodynamic atomization nozzles.

The nozzles 72, 74 and 76 are in fluid communication with reservoirs 82, 84 and 86, respectively. Accordingly, each of the shown nozzles is in fluid communication with a different reservoir than the other shown nozzles. In some embodiments, one of the nozzles (for instance, nozzle 72) may be referred to as a first nozzle in fluid communication with a first reservoir, and one of the other nozzles (for instance, nozzle 74) may be referred to as a second nozzle in fluid communication with a second reservoir. Although each reservoir is shown in fluid communication with a single nozzle, in other embodiments one or more of the reservoirs may be in fluid communication with multiple nozzles.

Different cleaning solutions may be present in each of the reservoirs so that multiple cleaning steps may be accomplished in apparatus 70 by generating aerosols from the nozzles 72, 74 and 76. For instance, one of the reservoirs may contain fluid particularly useful for dissolving silicon dioxide, another may contain fluid particularly useful for removing organic materials, and yet another may contain fluid particularly useful for removing silicon nitride. The aerosols formed from the nozzles may be utilized simultaneously in treating a substrate. However, some of the aerosols may interfere with the performance of others (for instance, one of the aerosols may be acidic and another basic), and in such embodiments it may be desired to utilize the aerosols sequentially relative to one another.

The nozzles 72, 74 and 76 may be connected with motors and circuitry of the type discussed above with reference to FIG. 1 so that the nozzles can be moved across a substrate during formation of aerosols with the nozzles; and the substrate holder may also be linked with motors and circuitry similar to that discussed above with reference to FIG. 1 so that the substrate may be rotated or otherwise moved during exposure to aerosols formed with the nozzles. Also, the angular tilt of the nozzles relative to the substrate may be adjusted to enhance particle movement and/or sweeping.

Figure 14:
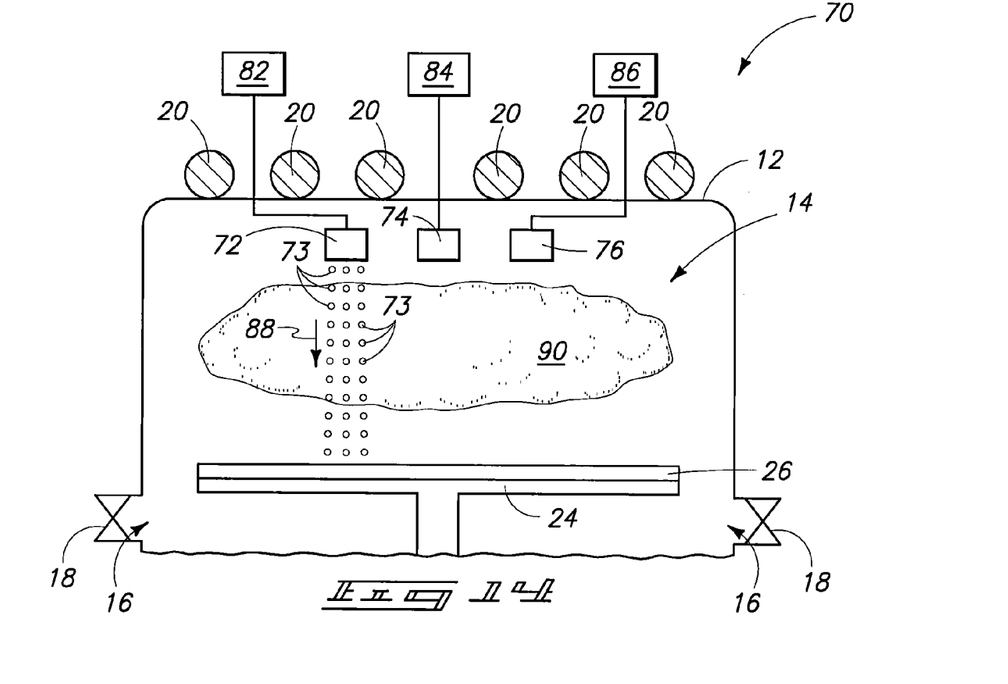

Referring to FIG. 14, nozzle 72 is utilized to form an aerosol comprising aerosol particles 73. Such particles are directed toward a surface of substrate 26 along the direction 88. The aerosol particles may impact the surface 26 to assist with removal of one or more materials from over such surface.

FIG. 14 also shows a plasma 90 formed within chamber 14 and utilized together with aerosol particles 73. Any of the embodiments discussed above with reference to FIGS. 1-12 may be utilized together with the apparatus of FIGS. 13 and 14. Accordingly, the aerosol may be utilized at a separate time from the plasma, and/or at an overlapping time with the plasma.

After the processing of FIG. 14, a nozzle different than 72 (specifically, nozzle 74 or 76) may be utilized to generate an aerosol which impacts a surface of substrate 26. The same plasma chemistry may be utilized with the different aerosols, or the plasma chemistry may be changed. Accordingly, the apparatus of FIGS. 13 and 14 may be versatilely used for accomplishing multiple treatment steps in a single chamber.

The utilization of both plasma and aerosol for removing materials from substrate surfaces may provide numerous advantages relative to utilization of either plasma or aerosol alone. For instance, the plasma may comprise chemistry synergistic with chemistry of the aerosol droplets to enhance removal of materials (such as the embodiment discussed above in which the plasma converts Si to $SiO_2$, and the aerosol droplets comprise HF for removing $SiO_2$.) Also, the plasma may enable tight control of voltage gradients during utilization of charged aerosol particles for removing materials. Additionally, the plasma chemistry may enhance performance of the aerosol chemistry, or vice versa (such as in embodiments in which the plasma is utilized for bulk stripping of materials, and the aerosol is utilized for removing remaining "crumbs" of material remaining after the bulk stripping).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method for treating a surface, comprising:

providing an apparatus that includes a chamber and a plurality of atomization nozzles proximate the chamber, a first of the nozzles being in fluid communication with a different liquid than a second of the nozzles;

placing a substrate within the chamber;

imparting a charge upon the substrate utilizing a power source;

forming a first aerosol within the chamber utilizing said first of the nozzles while not utilizing said second of the nozzles;

passing at least some of first aerosol across a space within the chamber toward a surface of the substrate, and utilizing the first aerosol to treat at least a portion of the substrate surface;

forming a second aerosol within the chamber utilizing said second of the nozzles while not utilizing said first of the nozzles;

passing at least some of second aerosol across a space within the chamber toward the substrate, and utilizing the second aerosol to treat at least a portion of the substrate surface; and exposing the substrate surface to multiple independent plasmas within the chamber, at least two of the multiple independent plasmas differing in composition from each other, the plasmas comprising one or more of Ar, Xe, Ne and Kr; at least one of the first and second aerosols comprising HF, at least one of the first and second aerosols being charged, the charged aerosol being of the same polarity of the substrate and being subjected to the presence of an electric field of a plasma sheath configured to interact with a polarity induced onto particulates on the substrate to assist in sweeping the particulates from the substrate, and at least one of said independent plasma steps comprising $O_3$.

2. The method of claim 1 comprising:

utilizing a first plasma during the utilizing of the first aerosol to treat at least a portion of the substrate surface;

utilizing a second plasma during the utilizing of the second aerosol to treat at least a portion of the substrate surface; and wherein the second plasma has a different composition than the first plasma.

3. The method of claim 2 wherein:

the first of the nozzles is in fluid communication with a first liquid having a first composition; and the second of the nozzles is in fluid communication with a second liquid having a second composition which is different from the first composition.

4. The method of claim 3 wherein one of the first and second compositions is acidic, and the other of the first and second compositions is basic.

5. A method for treating a surface, comprising:

providing an apparatus that includes a chamber and a plurality of atomization nozzles proximate the chamber, a first of the nozzles being in fluid communication with a different liquid than a second of the nozzles;

placing a substrate within the chamber;

imparting a charge upon the substrate utilizing a power source;

forming a first aerosol within the chamber utilizing said first of the nozzles while not utilizing said second of the nozzles;

passing at least some of first aerosol across a space within the chamber toward a surface of the substrate, and utilizing the first aerosol to treat at least a portion of the substrate surface;

forming a second aerosol within the chamber utilizing said second of the nozzles while not utilizing said first of the nozzles;

passing at least some of second aerosol across a space within the chamber toward the substrate, and utilizing the second aerosol to treat at least a portion of the substrate surface; and exposing the substrate surface to multiple independent plasma steps within the chamber; at least one of the first and second aerosols comprising HF, at least one of the first and second aerosols being charged, the charged aerosol being of the same polarity of the substrate and being subjected to the presence of an electric field gradient of a plasma sheath; wherein a plasma is also present in an absence of any aerosol.

6. The method of claim 5 comprising:

utilizing a first plasma during the utilizing of the first aerosol to treat at least a portion of the substrate surface;

utilizing a second plasma during the utilizing of the second aerosol to treat at least a portion of the substrate surface; and wherein the second plasma has a different composition than the first plasma.

7. The method of claim 6 wherein:

the first of the nozzles is in fluid communication with a first liquid having a first composition; and the second of the nozzles is in fluid communication with a second liquid having a second composition which is different from the first composition.

8. The method of claim 7 wherein one of the first and second compositions is acidic, and the other of the first and second compositions is basic.

* * * * *